United States Patent
Fu et al.

(10) Patent No.: US 6,323,655 B1
(45) Date of Patent: Nov. 27, 2001

(54) METHOD AND DEVICE FOR DETECTING PARTIAL DISCHARGES

(75) Inventors: Yan Hong Fu, Wageningen; Wijnand Reijer Rutgers, Elst, both of (NL)

(73) Assignee: N.V. Kema, Arnhem (NL)

( * ) Notice: Subject to any disclaimer, the term of this patent is extended or adjusted under 35 U.S.C. 154(b) by 0 days.

(21) Appl. No.: 09/380,074
(22) PCT Filed: Mar. 30, 1998
(86) PCT No.: PCT/NL98/00177
 § 371 Date: Dec. 7, 1999
 § 102(e) Date: Dec. 7, 1999
(87) PCT Pub. No.: WO98/44356
 PCT Pub. Date: Oct. 8, 1998

(30) Foreign Application Priority Data

Apr. 3, 1997 (NL) .................................................... 1005721

(51) Int. Cl.[7] .......................... G01R 31/08; G01R 31/06; G01R 29/20; H01H 31/12
(52) U.S. Cl. .......................... 324/536; 324/547; 324/553; 324/726; 340/646
(58) Field of Search .................... 324/536, 535, 324/546, 541, 545, 547, 553, 726; 340/646

(56) References Cited

U.S. PATENT DOCUMENTS

| | | | |
|---|---|---|---|
| 3,622,872 | * 11/1971 | Boaz | 324/536 |
| 3,684,951 | * 8/1972 | Harrold | 324/536 |
| 3,761,803 | * 9/1973 | Slough | 324/457 |
| 4,158,168 | * 6/1979 | Harrold | 324/535 |
| 4,158,169 | * 6/1979 | Harrold et al. | 324/535 |
| 4,238,733 | * 12/1980 | Freeman | 324/772 |
| 4,387,336 | * 6/1983 | Joy et al. | 324/515 |
| 4,929,903 | * 5/1990 | Saigo et al. | 324/544 |
| 4,967,158 | * 10/1990 | Gonzalez | 324/536 |
| 5,142,234 | * 8/1992 | Snead | 324/536 |
| 5,200,737 | * 4/1993 | Konishi et al. | 340/644 |
| 5,214,595 | * 5/1993 | Ozawa et al. | 702/58 |
| 5,252,927 | * 10/1993 | Bruhlmeier et al. | 324/546 |
| 5,477,150 | * 12/1995 | Ham, Jr. et al. | 324/536 |
| 5,530,366 | * 6/1996 | Nasrallah | 324/547 |
| 5,614,830 | * 3/1997 | Dickert et al. | 324/553 |
| 5,682,101 | * 10/1997 | Brooks et al. | 324/536 |
| 5,804,972 | * 9/1998 | De Kock et al. | 324/536 |
| 5,854,556 | * 12/1998 | Steennis et al. | 324/541 |
| 5,903,159 | * 5/1999 | Miyata et al. | 324/536 |
| 5,933,012 | * 8/1999 | Bengtsson et al. | 324/524 |

FOREIGN PATENT DOCUMENTS

| 2402877 | 4/1979 | (FR) . |
|---|---|---|
| 63012114 | 1/1988 | (JP) . |
| 02078975 | 3/1990 | (JP) . |

* cited by examiner

Primary Examiner—Glenn W. Brown
Assistant Examiner—Wasseem H. Hamdan
(74) Attorney, Agent, or Firm—Banner & Witcoff, Ltd.

(57) ABSTRACT

A method and device for detecting partial discharges in an electrical apparatus placed in a tank filled with oil, wherein the tank wall is provided with at least one drain tap. The device includes a probe mounted on a carrier that is movable through the opened drain tap into the tank. To move the probe into the tank while avoiding leakage of the oil, a sleeve maybe coupled to a flange of the drain tap an the carrier may be moved within the sleeve. The probe may be moved so that it at least coincides with the inner surface of the tank wall, or even further, and then measurements may be performed to detect partial discharges.

13 Claims, 1 Drawing Sheet

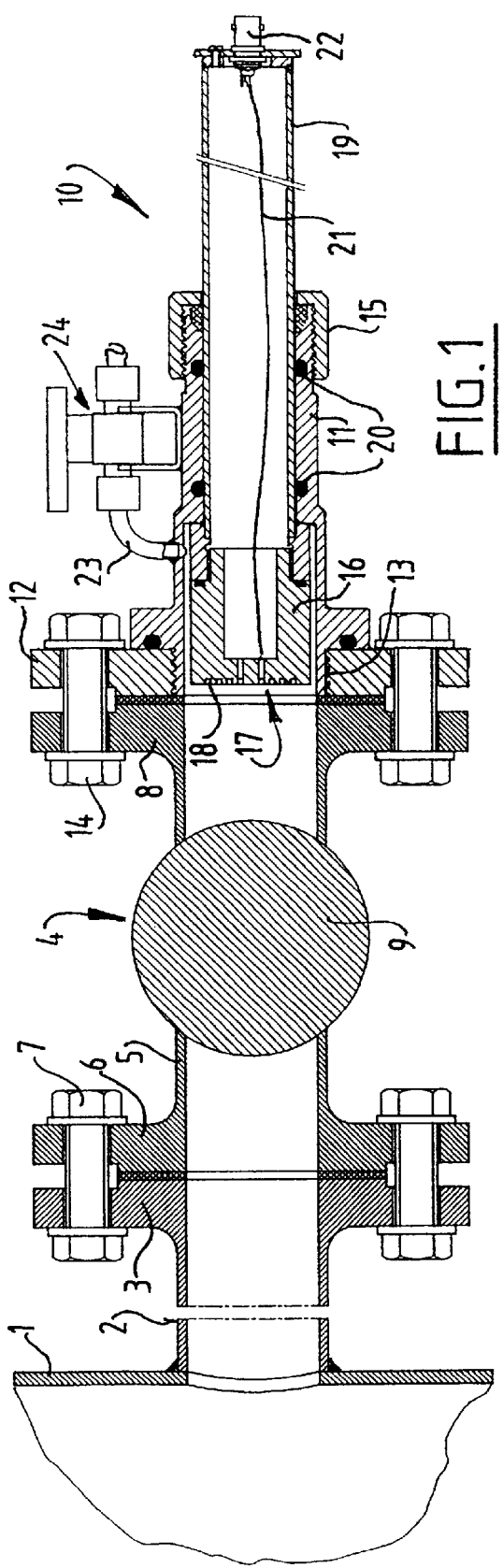
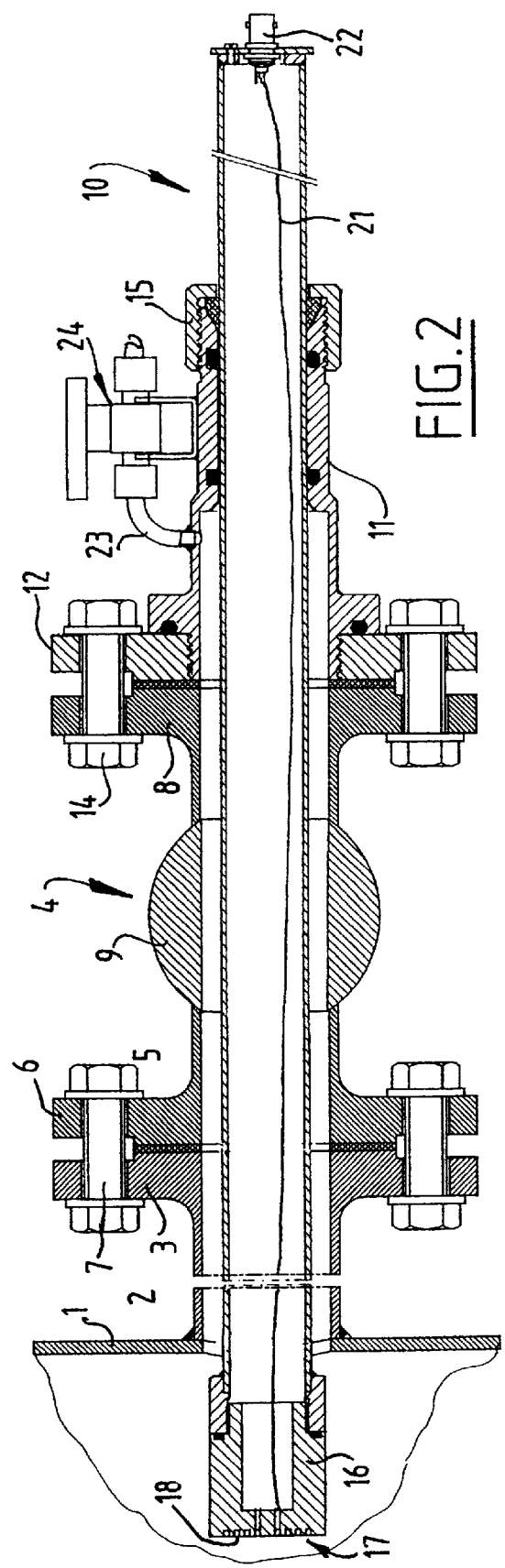

METHOD AND DEVICE FOR DETECTING PARTIAL DISCHARGES

BACKGROUND OF THE INVENTION

1. Field of the Invention

The present invention relates to a device for detecting partial discharges in an electrical apparatus placed in a tank filled with oil, wherein the tank wall is provided with at least one drain tap.

Belonging to the category of such apparatus are inter alia generator, coupling and distribution transformers of large capacity. These are placed in a tank filled with oil.

Other categories of apparatus which are placed in a tank filled with oil, such as compensating coils, are however by no means excluded.

2. Description of the Related Art

In order to determine the quality of operation of such an apparatus, particularly in respect of the quality of the applied insulation materials and deriving therefrom the anticipated operating time until a subsequent failure and the remaining life expectancy, the detection of partial discharges is of the greatest importance. Partial discharges often represent the prelude to destructive processes in such an apparatus.

According to presently known electrical measuring techniques, use is made of an apparatus wherein the transformer is taken out of operation, the transformer is placed in a measuring arrangement and a measurement is then performed. It is possible herein for such a measurement also to be carried out during operation. In order to arrange the measuring equipment and remove it after the measurement has been performed, the transformer must however be taken out of operation. It will be apparent that this is less than desirable on account of the economic consequences of taking a transformer out of operation, particularly when it is a generator transformer.

SUMMARY OF THE INVENTION

The object of the present invention is however to provide a device with which it is possible to detect possible partial discharges in such an apparatus without the apparatus having to be taken out of operation.

It is also an object of the present invention to provide a method for detecting partial discharges in an electrical apparatus placed in a tank filled with oil, the tank wall of which is provided with at least one drain tap, wherein the apparatus likewise does not have to be taken out of operation.

This object is achieved with such a device, wherein the measuring device comprises a probe which is mounted on a carrier which is movable through the opened drain tap into the tank.

This object is further achieved with such a method, wherein a sleeve is initially placed on the flange of the drain tap and a carrier which is movable in the sleeve and on which a probe is placed is subsequently moved through the opened tap until the measuring surface of the probe at least coincides with the inner surface of the tank wall, and the measurement is then performed.

As a result of these two measures it is possible to test a transformer or other electrical apparatus for partial discharges, without the apparatus having to be taken out of operation.

It is pointed out herein that in the majority of such apparatuses drain taps are provided for drawing off the oil, which drain tap can be easily used for introducing the probe according to the invention.

It is further pointed out that performing measurements for partial discharges in a closed tank inside which an electrical apparatus is situated is per se known from the field of closed switching gear. Herein however, the probe is already arranged fixedly in the tank during manufacture of such equipment and provided with connecting means which are guided to the outside, so that such a measurement can be performed using such a probe. This relates however to closed switching gear filled with $SF_6$ gas.

DESCRIPTION OF THE DRAWINGS

The invention will be elucidated hereinbelow with reference to the annexed drawings, in which:

FIG. 1 shows a cross-sectional view of a drain tap of a transformer tank to which the device according to the present invention is arranged; and FIG. 2 shows a view corresponding with FIG. 1 wherein the probe is carried into the measuring position in the interior of the transformer tank.

DETAILED DESCRIPTION OF THE INVENTION

Shown in FIG. 1 is a transformer tank wall 1 of a transformer tank which is connected by means of welding to a pipe piece 2 to which is fixed a flange 3.

Mounted on this assembly is a tap designated as a whole with 4, which is formed by a pipe piece 5 provided on one side with a flange 6 which is connected by means of bolts 7 to flange 3.

On the other side the pipe piece 5 is connected to a flange 8. Incorporated in pipe piece 5 is a tap which is designated by means of a hatched circle 9. A usual transformer is provided with such an assembly which is used to draw off the oil present in the tank when the oil must be replaced or cleaned or when the transformer must be tested.

The present invention makes use of the presence of such a drain tap by placing on flange 8 a device according to the invention, integrally designated 10. The device is formed by a sleeve 11 which is substantially cylindrical and which is connected on one side to a flange 12. In the present embodiment this connection takes place by means of screw thread 13; it will be apparent that other connection options can be used. Flange 12 can be connected to flange 8 by means of bolts 14.

The sleeve 11, which is otherwise substantially cylindrical, is provided on its free end with a cap 15 which is provided with a hole and connected to the sleeve by means of screw thread.

The actual probe is formed by a measuring head 16 which is provided with an antenna 18 in its end surface 17. The present embodiment has a spiral-shaped antenna 18 but it is equally possible to apply differently shaped antennas for this purpose.

Measuring head 16 is connected to a cylindrical and in the present case hollow carrier 19 which is passed through sleeve 11.

Pipe 19 herein fits precisely into sleeve 11. In order to make a good seal, O-rings 20 are further arranged in sleeve 11. Antenna 18 is connected by means of a wire connection 21 to a BNC connector 22 for coaxial cables which is connected to the free end surface of the carrier. The connection 21 is preferably also embodied as coax cable.

Finally, a drain conduit 23 is arranged which debouches in a widened part of sleeve 11. This drain conduit 23 is connected to a secondary valve 24 which is intended for removing air after assembly. This prevents air being admitted into the apparatus during sliding inward of this assembly.

During performing of the method according to the invention the assembly formed by sleeve 11, flange 12 and the pipe movable in the sleeve and having measuring head 16 mounted thereon is fixed by means of bolts 14, as shown in FIG. 1. Tap 9 is herein initially closed, as also shown in FIG. 1.

Air is subsequently removed and tap 9 is opened, this as according to the situation shown in FIG. 2, whereafter pipe 19 is moved inward through the sleeve 11, this as far as is shown in FIG. 2. The end surface 17 is herein situated fully in the interior of the transformer tank. It is possible instead to allow the end surface 17 to coincide with the inner surface of tank wall 1. Measuring equipment can thereafter be connected to the BNC connector 22 by means of a coax cable and the measurement can be performed. The starting point herein is the principle that partial discharges which are present generate electromagnetic radiation which is propagated through the oil in tank 1. This radiation can be received by antenna 18 and conducted further to the measuring equipment via cable 21, BNC connector 22 and the cable connected thereto.

Instead of the antenna 18 for receiving electromagnetic radiation, it is also possible to mount a microphone for recording sound which is propagated through the oil. However, experience shows that such a principle leads to attractive results only in particular cases, for instance only when the discharge is situated in the direct vicinity of the microphone.

After the measurement has been performed, the probe consisting of pipe 19 and the measuring head 16 mounted thereon can be withdrawn in its entirety and the tap closed, and the whole measuring apparatus can be removed.

What is claimed is:

1. A device for detecting partial discharges in an electrical apparatus disposed in a tank filled with oil, wherein the tank wall is provided with at least one drain tap, the device comprising a probe mounted on a carrier which is movable through the drain tap into the tank.

2. The device as claimed in claim 1, wherein the probe comprises a substantially spiral-shaped antenna, the diameter of which is smaller than the external diameter of the carrier.

3. The device as claimed in claim 2, further including a connection for a drain conduit disposed between the flange and the seal and connected to the sleeve.

4. A method for detecting partial discharges in an electrical apparatus disposed in a tank filled with oil, wherein the tank wall is provided with at least one drain tap, the method comprising the steps of:

coupling a sleeve to a flange of the drain tap and a carrier which is movable in the sleeve and on which a probe is disposed;

moving the probe through the opened drain tap at least until a measuring surface of the probe coincides with the inner surface of the tank wall; and performing a measurement by the probe.

5. The method as claimed in claim 4, further including the steps of, after the measurement has been performed, withdrawing the probe, closing the drain tap, and uncoupling the sleeve from the flange.

6. A device for detecting a partial discharge in a tank containing an electrical apparatus and an insulating fluid around the electrical apparatus, the tank having at least one drain tap, the device comprising:

a sleeve configured to be coupled to the drain tap; and an elongated carrier disposed within the sleeve, the carrier having a probe configured to detect the partial discharge, the carrier being configured to be moveable within the sleeve such that the probe passes through the drain tap.

7. The device of claim 6, wherein the probe is disposed near one end of the elongated carrier, and further including a conductive wire coupled to the probe and running from the probe to the other end of the elongated carrier, the probe being configured to generate, responsive to the partial discharge, a signal and send it into the conductive wire.

8. The device of claim 6, wherein the drain tap has a first flange, the device further including a second flange configured to be coupled to the first flange.

9. The device of claim 6, wherein when the sleeve is coupled to the drain tap, a seal is made between the sleeve and the drain tap sufficient to prevent leakage of the fluid, the sleeve and the carrier further having a seal therebetween sufficient to prevent leakage of the fluid.

10. A device for detecting a partial discharge in a tank containing an electrical apparatus and an insulating fluid around the electrical apparatus, the tank having at least one drain tap, the device comprising:

a sleeve configured to be coupled to the drain tap; and a probe configured to detect the partial discharge, the probe further configured to move within the sleeve such that the probe travels in and out of the drain tap.

11. A method for detecting a partial discharge in a tank containing an electrical apparatus and an insulating fluid around the electrical apparatus, the method comprising the steps of:

coupling a sleeve to a drain tap of the tank;

opening the drain tap;

moving a probe through the sleeve in a first direction such that the probe passes through the open drain tap;

using the probe, detecting whether a partial discharge exists within the tank;

moving the probe through the sleeve in a second direction such that the probe passes back out the open drain tap; and closing the drain tap.

12. The method of claim 11, wherein the step of moving the probe in the first direction includes moving the probe so as to at least coincide with an inner surface of the tank.

13. The method of claim 11, wherein the step of moving the probe in the first direction includes moving the probe so as to be at least partially disposed within the tank.

* * * * *